United States Patent
Grover et al.

(10) Patent No.: US 8,982,651 B2
(45) Date of Patent: Mar. 17, 2015

(54) MEMORY WITH AN ASSIST DETERMINATION CONTROLLER AND ASSOCIATED METHODS

(71) Applicant: STMicroelectronics International N.V., Amsterdam (NL)

(72) Inventors: Anuj Grover, New Delhi (IN); Gangaikondan Subramani Visweswaran, New Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 175 days.

(21) Appl. No.: 13/852,222

(22) Filed: Mar. 28, 2013

(65) Prior Publication Data

US 2014/0293723 A1    Oct. 2, 2014

(51) Int. Cl.
G11C 7/00    (2006.01)
G11C 7/02    (2006.01)
G11C 7/06    (2006.01)

(52) U.S. Cl.
CPC ........................................ G11C 7/06 (2013.01)
USPC ........................................ 365/205; 365/210.1

(58) Field of Classification Search
USPC .............................................. 365/205, 210.1
See application file for complete search history.

(56) References Cited

U.S. PATENT DOCUMENTS

| 6,920,079 | B2 * | 7/2005 | Shibayama | 365/210.1 |
| 6,996,020 | B2 * | 2/2006 | Yoshida | 365/210.1 |
| 7,515,502 | B1 * | 4/2009 | Ahsan et al. | 365/210.1 |
| 7,739,531 | B1 | 6/2010 | Krishnan | |
| 7,880,505 | B2 | 2/2011 | Khatri et al. | |
| 8,259,486 | B2 | 9/2012 | Kumar et al. | |
| 8,310,883 | B2 | 11/2012 | Yabuuchi et al. | |
| 8,320,164 | B2 | 11/2012 | Chuang et al. | |
| 8,537,625 | B2 * | 9/2013 | Ramaraju et al. | 365/210.1 |
| 8,817,551 | B2 * | 8/2014 | Kuroda | 365/210.1 |
| 2008/0273388 | A1 | 11/2008 | Chin et al. | |
| 2013/0055175 | A1 | 2/2013 | Jamann et al. | |

OTHER PUBLICATIONS

Fujimura et al, "A Configuable SRAM with Constant-Negative-Level Write Buffer for Low-Voltage Operation with 0.149UM2 Cell in 32 NM High-K Metal-Gate CMOS" ISSCC 2010/Session 19 High-Perfomance Embedded Memory/19.4.
Chang et al. "A 20NM 112 MB SRAM in High-K Metal-Gate With Assist Circuit for Low-Leakage and Low-VMIN Applications" OSSCC 2013/Session 18/Advanced Embedded SRAM/18.1.
Sharma et al. "Chapter 2: SRAM Bit Cell Optimization" Analog Circuits and Signal Processing, Springer Science+Business Media, New York 2013.
Quocdat Tai Nguyen Read/Write Assist Circuits and SRAM Design.

* cited by examiner

Primary Examiner — Trong Phan
(74) Attorney, Agent, or Firm — Allen, Dyer, Doppelt, Milbrath & Gilchrist, P.A.

(57) ABSTRACT

A memory includes an array of active memory cells arranged in rows and columns, and at least one dummy memory cell column adjacent the array of active memory cells. A sensing circuit is coupled to the at least one dummy memory cell column to sense at least one variation associated with the at least one dummy memory cell column. An assist circuit is coupled to the array of active memory cells. An assist determination controller is coupled to the sensing circuit to store a look-up table of output assist values corresponding to different variations associated with the at least one dummy memory cell column, to determine an output assist value from the look-up table based upon the at least sensed variation, and to operate the assist circuit based upon the determined output assist value.

26 Claims, 5 Drawing Sheets

MEMORY WITH AN ASSIST DETERMINATION CONTROLLER AND ASSOCIATED METHODS

FIELD OF THE INVENTION

The present invention relates to the field of integrated circuits, and more particularly, to a semiconductor memory device with assist to operate at a low voltage, and related methods.

BACKGROUND

Manufacturers of a system on chip (SoC) are sensitive to the need to improve the energy efficiency of such devices. Various measures may be taken to reduce power consumption, such as operating at a lower voltage. For a low power SoC, a configurable SRAM operating at low voltage is a key component.

As these devices are scaled, the low-voltage functionality of high density SRAMS has been compromised. Increased threshold-voltage variation of scaled transistors reduces the static noise margin (SNM) and write margin (WM) of the SRAM bit cell. The effect is more predominant for high-density SRAMs due to small device sizes and large memory capacity requirements.

Moreover, lower voltages typically reduce the speed at which signals propagate through the memory. Transistor delays and RC delays associated with a memory scale differently as the voltage is lowered. Consequently, the memory may not operate as fast as needed or desired.

Voltage scaling is used to ensure reliability of the memory and to ensure a reduced power consumption. Voltage scaling is a technique whereby the drive voltage to a particular part of the memory is modulated to one or more particular values such that the memory can function properly. Voltage scaling is particularly suited to compensate for process variations. Static voltage scaling may be performed at the factory (e.g., during calibration), or before the memory begins normal operation (e.g., during power-up initialization). In contrast, dynamic voltage scaling (DVS) is performed continually while the memory is in normal operation, and is particularly effective at compensating for temperature variations and memory aging as well as process variations.

As the voltage is lowered, an influence of variations in various manufacturing parameters increases, and may cause large variations in the threshold voltage of the transistors that form a memory cell. Consequently, it becomes difficult to perform stable writing and reading of data in a memory with a low power supply voltage.

Signals that propagate too slowly through the memory cause setup violations. Signals that propagate too quickly through the memory cause hold violations. Setup or hold violations corrupt the flow of logic and give rise to functional errors.

Various structures have been proposed for stably writing and reading data in a memory with such a low power supply voltage. For example, U.S. Pat. No. 8,301,883 discloses a driver power supply circuit stepping down a power supply voltage at a power supply node of a word line driver. The driver power supply circuit includes a resistance element and a pull-down circuit lowering a voltage level of the driver power supply node. The pull-down circuit includes a pull-down transistor having the same threshold voltage characteristics as a memory cell transistor pulling down a voltage level of the driver power supply node, and a gate control circuit adjusting at least a gate voltage of the pull-down transistor. The gate control circuit corrects the gate potential of the pull-down transistor in a manner linked to variations in threshold voltage of the memory cell transistor.

Another approach is based on a constant-negative-level write buffer (CNL-WB) and a level programmable wordline driver for single supply (LEWD-SS) operation, as disclosed in the article titled "A Configurable SRAM with Constant-Negative-Level Write Buffer for Low-voltage Operation with 0.149 $\mu m^2$ Cell in 32 nm High-k Metal-Gate CMOS", IEEE International Solid-State Circuits Conference, 2010, pp. 348-350. The CNL-WB uses a bootstrap circuit by automatically adjusting the BL bias to an optimized constant negative level. The amount of charge stored in the bootstrap capacitor is automatically controlled depending on the number of rows. To generate a constant BL level, the additional charge stored in the capacitor is proportional to the BL capacitance increase.

Yet another approach is based on a partially suppressed wordline (PSWL) scheme for read assist and a bitline-length-tracked negative-bitline-boosting (BT-NBL) scheme for write assist, as disclosed in the article titled "A 20 nm 112 Mb SRAM in High-k Metal-Gate with Assist Circuitry for Low-Leakage and Low-$V_{min}$ Applications", IEEE International Solid-State Circuits Conference, 2013, pp. 316-318. Since the negative bitline coupling time is crucial for the negative bias coupling efficiency, a replica column with a replica write buffer tracks the SRAM bitline configuration. During the write operation, the write signal pulse triggers the replica write buffer of the replica column to discharge the replica bitline to generate a negative bitline enable signal. The falling edge of the selected bitline through a write driver and the write column-MUX to increase the gate-source bias of the selected bitcell pass-gate transistor enhances the write capability.

Even in view of the above approaches for operating a memory at low voltage, there is still a need to improve on providing the proper assist to the memory.

SUMMARY

In view of the foregoing background, it is therefore an object of the present disclosure to provide a memory that can determine how much assist is desired so as to operate at a low voltage without degrading performance.

This and other objects, features, and advantages are provided by a memory comprising an array of active memory cells arranged in rows and columns, and at least one dummy memory cell column adjacent the array of active memory cells. A sensing circuit may be coupled to the at least one dummy memory cell column to sense at least one variation associated with the at least one dummy memory cell column. An assist circuit may be coupled to the array of active memory cells. An assist determination controller is coupled to the sensing circuit to store a look-up table of output assist values corresponding to different variations associated with the at least one dummy memory cell column, determine an output assist value from the look-up table based upon the at least sensed variation, and operate the assist circuit based upon the determined output assist value.

The assist determination controller allows the memory to operate at a low voltage without degrading performance by determining the desired assist to be applied by the assist circuit to the array of active memory cells. The assist determination controller advantageously uses the sensed variations associated with the dummy memory cell columns, and the stored look-up table of output assist values to determine the desired assist.

The at least one dummy memory cell column may comprise a plurality of programmable discharge memory devices, with each programmable discharge memory device comprising at least one discharge transistor. The at least one dummy memory cell column may also comprise a plurality of programmable load memory devices, with each load memory device comprising at least one load transistor.

The at least one dummy memory cell column may comprise at least one sense line coupled to the plurality of programmable discharge memory devices and to the plurality of programmable load memory devices, at least one activation line coupled to the plurality of programmable discharge memory devices, at least one programmable discharge programming line coupled to the plurality of programmable discharge memory devices, and at least one programmable load programming line coupled to the plurality of programmable load memory devices.

The at least one sense line may be coupled to the plurality of programmable discharge memory devices via the respective discharge transistors, and to the plurality of programmable load memory devices via the respective load transistors.

The assist determination controller may be configured to program the plurality of programmable discharge memory devices via the at least one programmable discharge programming line, and program the plurality of programmable load memory devices via the at least one programmable load programming line.

The assist determination controller may be configured to first activate the plurality of programmable discharge memory devices, and then activate the sensing circuit at a set time after activation of the plurality programmable discharge memory devices to sense the at least one variation associated with the at least one dummy memory cell column.

Each programmable discharge memory device may comprise at least one memory transistor, and the at least one discharge transistor may be configured as an access transistor coupled to the at least one memory transistor.

Alternatively, each programmable discharge memory device may comprise at least one additional transistor, and the at least one discharge transistor may be coupled to the at least one additional transistor to define a pair of pull-up devices.

Alternatively, the at least one discharge transistor may be configured as a pull-down device.

The at least one variation may comprise at least one of a process variation, a voltage variation, a temperature variation, and a leakage current variation. The array of active memory cells may be configured so that the memory is a static memory.

The assist determination controller may be configured to periodically determine the output assist value, and to periodically operate the assist circuit based upon the determined output assist value. The assist determination controller also be configured to store the look-up table of output assist values further based on different operating voltages.

Another aspect is directed to a method for operating a memory as described above. The method comprises operating the sensing circuit to sense at least one variation associated with the at least one dummy memory cell column; and operating the assist determination controller to determine an output assist value from the look-up table based upon the at least sensed variation, and to operate the assist circuit based upon the determined output assist value.

DETAILED DESCRIPTION OF THE PREFERRED EMBODIMENTS

The present embodiments will now be described more fully hereinafter with reference to the accompanying drawings, in which preferred embodiments are shown. The embodiments may, however, be embodied in many different forms and should not be construed as limited to the embodiments set forth herein. Rather, these embodiments are provided so that this disclosure will be thorough and complete, and will fully convey the scope of the disclosure to those skilled in the art. Like numbers refer to like elements throughout, and prime and multiple notations are used to indicate similar elements in alternative embodiments.

Figure 1:
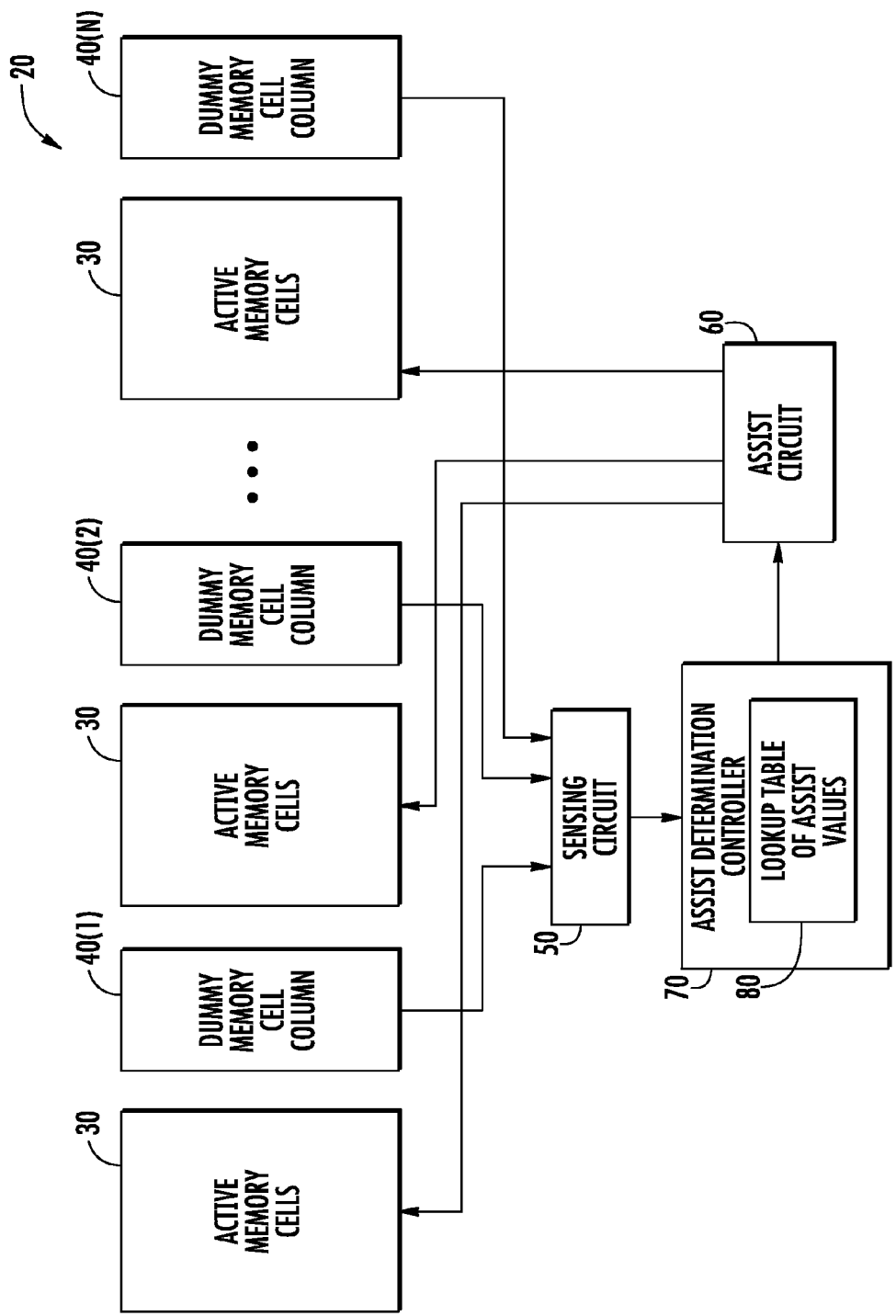
FIG. 1 is a block diagram of a memory in accordance with the present embodiment.

Referring initially to FIG. 1, the illustrated memory 20 includes an array of active memory cells 30 arranged in rows and columns, and at least one dummy memory cell column 40(1) adjacent the array of active memory cells. The array of memory cells 30 are configured so that the memory 20 is a static memory, such as a ROM or an SRAM, for example.

In the illustrated embodiment, there are multiple dummy memory cell columns 40(1)-40(n) spaced throughout the array of active memory cells 30, where n may be less than or equal to 10, for example. Alternatively, there may be more than 10 dummy memory cell columns depending on the size of the memory 20.

As will be explained in greater detail below, the dummy memory cell columns 40(1)-40(n) are used by the assist determination controller 70 to determine how much assist is desired for the array of active memory cells 30. Even though the dummy memory cell columns 40(1)-40(n) are mixed within the array of active memory cells 30, they do not store active data.

A sensing circuit 50 is coupled to the dummy memory cell columns 40(1)-40(n) to sense at least one variation associated with each dummy memory cell column. Even though the dummy memory cell columns 40(1)-40(n) are programmable to store a 1 or a 0, this is to allow the sensing circuit 50 to sense at least one variation under simulated conditions that is representative of the array of active memory cells 30. The sensing circuit 50 is separate from the typical sensing amplifiers associated with the array of active memory cells 30. The at least one variation, for example, may be a process variation, a voltage variation, a temperature variation, and/or a leakage current variation.

An assist circuit 60 is coupled to the array of active memory cells 30. An assist determination controller 70 is coupled to the sensing circuit 50 to store a look-up table 80 of output assist values corresponding to different variations associated with the dummy memory cell columns 40(1)-40(n) to determine an output assist value from the look-up table based upon the at least sensed variation. The assist determination controller 70 then operates the assist circuit 60 based upon the determined output assist value.

The assist circuit 60 may be configured to provide assistance to read/write circuits, such as providing negative biasing and wordline level control to the array of active memory cells 30, for example. The assist circuit 60 may also be configured to include delay circuits for selectively providing delays within the memory itself. In addition, the assist circuit 60 may also be configured to increase/decrease the size of various circuits in the memory to enhance memory operation, as readily understood by those skilled in the art. Other assist approaches are equally acceptable.

The assist determination controller 70 allows the memory 20 to operate at a low voltage by determining the desired assist to be applied by the assist circuit 60 to the array of active memory cells 30. The assist determination controller 70 advantageously uses the sensed variations associated with the dummy memory cell columns 40(1)-40(n) and the stored look-up table 80 of output assist values to determine the desired assist.

Figure 2:
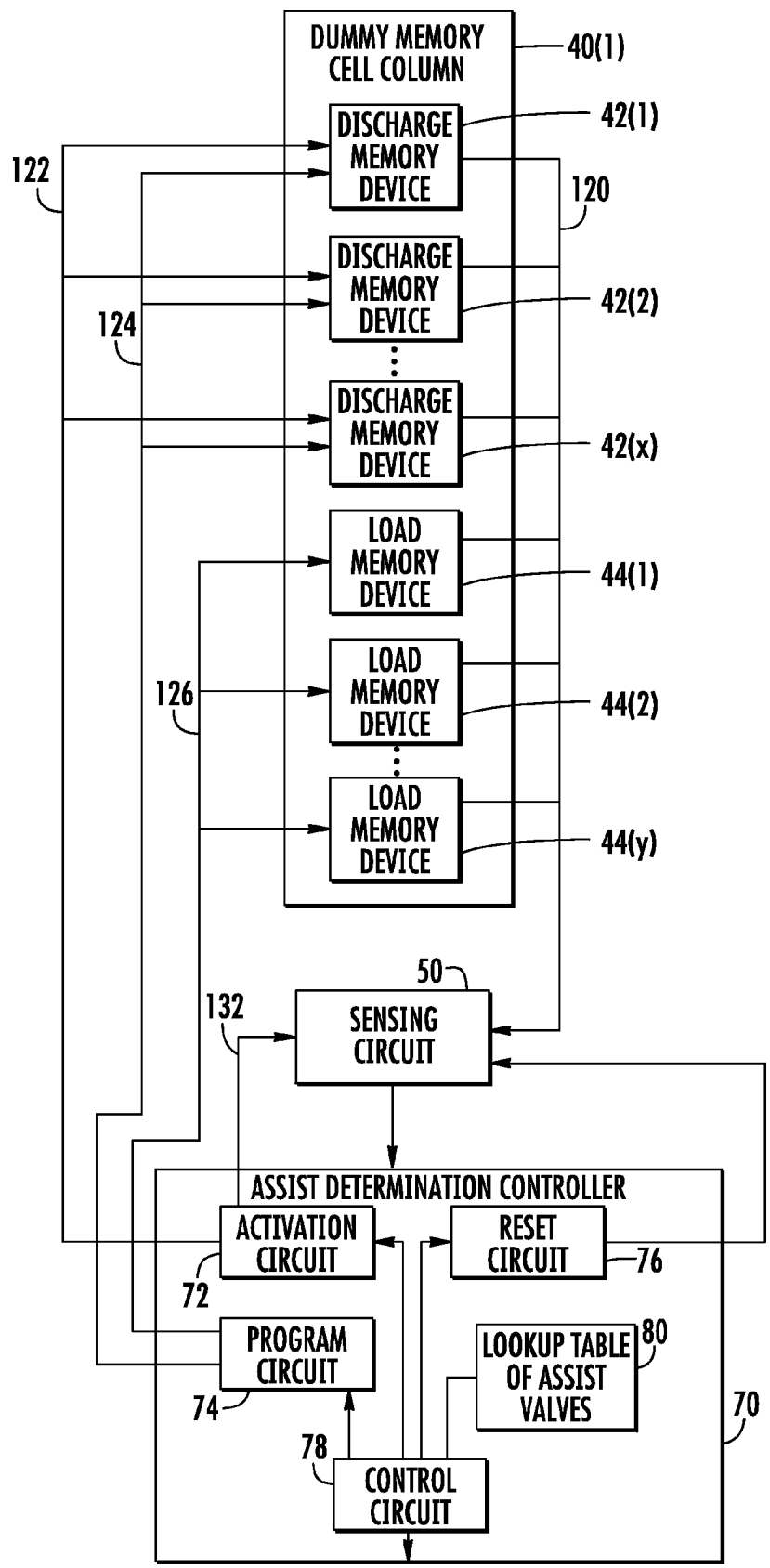
FIG. 2 is a more detailed block diagram of the assist determination controller and one of the dummy memory cell columns illustrated in FIG. 1.
Figure 3:
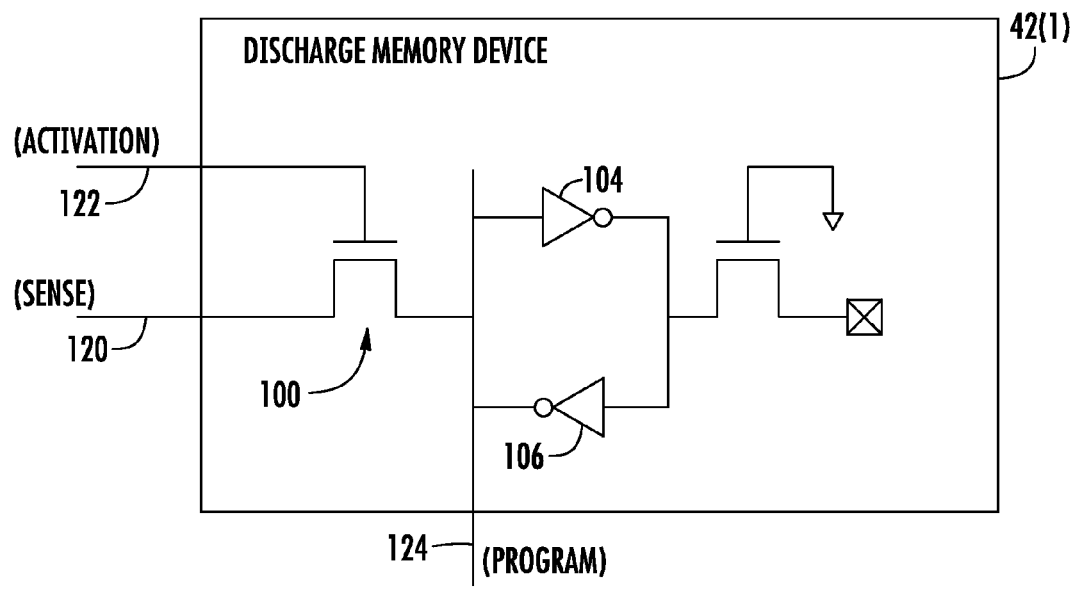
FIG. 3 is a more detailed block diagram of the discharge memory device illustrated in FIG. 2.
Figure 4:
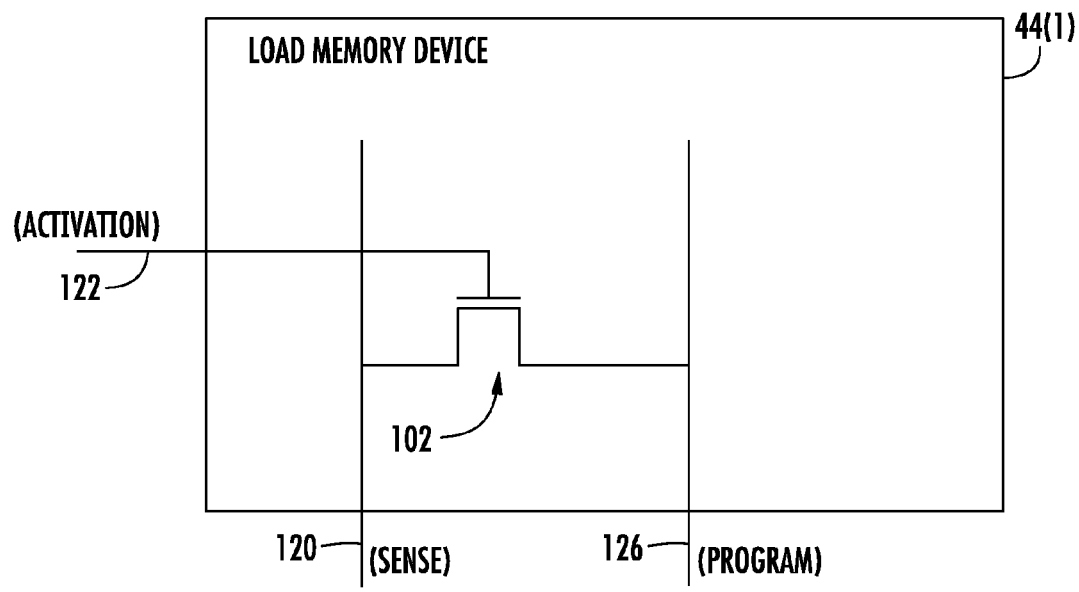
FIG. 4 is a more detailed block diagram of the load memory device illustrated in FIG. 2.

Referring now to FIGS. 2-4, sensing of the dummy memory cell columns 40(1)-40(n) will be discussed in greater detail. For discussion purposes, only one dummy memory cell column 40(1) is coupled to the sensing circuit 50 and to the assist determination controller 70. Operation of the illustrated dummy memory cell column 40(1) is similar to operation of the other dummy memory cell columns 40(2)-40(n), as will be readily appreciated by those skilled in the art.

Each dummy memory cell column 40(1) illustratively comprises a plurality of programmable discharge memory devices 42(1)-42(x), and a plurality of programmable load memory devices 44(1)-44(y). Each programmable discharge memory device 42(1) includes at least one discharge transistor 100 as illustrated in FIG. 3, and each programmable load memory device 44(1) includes at least one load transistor 102 as illustrated in FIG. 4. Each discharge transistor 100 may have the same dimensions and threshold voltage as transistors in the active memory cells 30.

The discharge transistors 100 are used by the sensing circuit for sensing a process variation, a voltage variation, a temperature variation, and a leakage current variation. The load transistors 102 are to provide a capacitive load to the sensing circuit 50 that is representative of the capacitive characteristics of the array of memory cells 30. Similarly, each load transistor 102 may have the same dimensions and threshold voltage as transistors in the active memory cells 30. The number of load memory devices 44(1)-44(y) may not equal the number of discharge memory devices 42(1)-42(x). In fact, the number of load memory devices 44(1)-44(y) connected to the sensing circuit 50 may vary between the different dummy memory cell columns 40(1)-40(n). The number of load memory devices 44(1)-44(y) connected to the sensing circuit 50 may also be selected to provide an equivalent drive strength so that only one signal is used for triggering the sensing circuit 50.

The illustrated assist determination controller 70 includes an activation circuit 72, a program circuit 74, a reset circuit 76 and a control circuit 78 coupled to these other circuits. The control circuit 78 is also coupled to the lookup table of assist values 80, which may be a memory circuit, as readily appreciated by those skilled in the art.

For each dummy memory cell column 40(1), a sense line 120 is coupled from the sensing circuit 50 to both the programmable discharge memory devices 42(1)-42(x) and the programmable load memory devices 44(1)-44(y). An activation line 122 is coupled from the activation circuit 72 to the programmable discharge memory devices 42(1)-42(x).

Also, a programmable discharge programming line 124 is coupled from the program circuit 74 to the programmable discharge memory devices 42(1)-42(x), and a programmable load programming line 126 is also coupled from the program circuit to the programmable load memory devices 44(1)-44(y). The program circuit 74 is configured to program a logic 1 or 0 on the discharge transistors 100 and the load transistors 102. In lieu of the program circuit 74 programming these transistors, the discharge transistors 100 and the load transistors 102 may be hard coded separate from the assist determination controller 70.

More particularly, the sense line 120 is coupled to the programmable discharge memory devices 42(1)-42(x) via the respective discharge transistors 100, and to the programmable load memory devices 44(1)-44(y) via the respective load transistors 102. The activation circuit 72 is configured to first activate the programmable discharge memory devices 42(1)-42(n), and then activate the sensing circuit 50 via activation line 132 at a set time after activation of the programmable discharge memory devices to sense the at least one variation associated with the dummy memory column 40(1).

As an example, after the program circuit 74 programs the respective discharge transistors 100 and load transistors 102, an activation signal at time $T_1$ is provided to the discharge transistors on activation line 122 from the activation circuit 72. If the discharge transistors 100 are charged to a logic 1, then the activation line causes the discharge transistors to discharge. At time $T_2$, an activation signal is sent to the sensing circuit 50 on activation line 132 from the activation circuit 72.

At time $T_2$, the sensing circuit 50 senses a voltage level on the sense line 120 that is representative of the discharge transistors 100 discharging. For example, the supply voltage of the memory 20 may be 0.85 volts. As provided in TABLE 1, the memory 20 may be divided into 3 different lots: slow, typical and fast. Each lot will have voltage ranges associated therewith corresponding to the operating voltage of the memory 20.

For a sensed discharge voltage of 300 mV, for example, this falls within the normal or typical lot where medium assist is used. If the sensed discharge voltage had been 350 mV, for example, then this would have fallen within the slow lot where full assist would be used. Similarly, if the sensed discharge voltage had been 200 mV, for example, then this would have fallen within the fast lot where no assist would be used. Each lot section in TABLE 1 for the different operating voltages thus has predetermined voltage ranges associated therewith.

TABLE 1

|  | 0.8 V | 0.85 V | 0.9 V |
| --- | --- | --- | --- |
| SLOW LOT | FULL ASSIST | FULL ASSIST | MEDIUM ASSIST |
| TYPICAL LOT | FULL ASSIST | MEDIUM ASSIST | NO ASSIST |
| FAST LOT | MEDIUM ASSIST | NO ASSIST | NO ASSIST |

Each voltage range allows the assist determination controller 70 to determine how much assist needs to be provided to the array of active memory cells 30. As an alternative to sensing discharge voltages, charge voltages may be sensed. In addition, currents may also be sensed, where a sensed current level is then compared to a range of predetermined current levels for the different operating voltages and lots.

As discussed above, the programmable load memory devices 44(1)-44(y) provide a capacitive load to the sensing circuit 50 that is representative of the capacitive characteristics of the array of memory cells 30. The capacitive characteristics of the array of memory cells 30 effect performance of the memory 20.

For example, C is considered to be the capacitance of the sense line 120 which is also referred to as a replica node (replica bitline). Due to a significant component of drain capacitance, the capacitance C changes with the lot point (by a factor $p\Delta$). Here $\Delta$ is the shift in threshold voltage of the lot from the nominal or TYPICAL lot, and p is the proportionality constant. Without any loss of generality, it is assumed that drain capacitance is lower at SLOW lots.

$$C = C_{row}(1-p\Delta)$$

Current charging this capacitance C is as below:

$$I = nk(V_{dd} - V_x(t) - V_t - \Delta)^2$$

Here, n is the number of discharging cells, k is the technology factor and $V_x(t)$ is the voltage of the replica node at the given instant. It is assumed that the pass-gate devices 100 are all in saturation.

$$\int_0^{V_x} C dV_x = \int_0^t nk(V_{dd} - V_x(t) - V_t - \Delta)^2 dt$$

$$\int_{10}^{V_x} \frac{C dV_x}{(V_{dd} - V_x(t) - V_t - \Delta)^2} = \int_0^t nk dt$$

$$\frac{C}{(V_{dd} - V_x(t) - V_t - \Delta)}\bigg|_0^{V_x} = nkt\bigg|_0^t$$

$$\frac{C}{(V_{dd} - V_x(t) - V_t - \Delta)} - \frac{C}{(V_{dd} - V_t - \Delta)} = nkt$$

$$\frac{CV_x}{(V_{dd} - V_x - V_t - \Delta) \cdot (V_{dd} - V_t - \Delta)} = nkt$$

Replacing, $V_{ov} = V_{dd} - V_t - \Delta$, $$V_x = nktV_{ov}(V_{ov} - V_x)$$

$$(C + nktV_{ov})V_x = nktV_{ov}^2$$

$$V_x = \frac{nktV_{ov}^2}{(C + nktV_{ov})} = \frac{nkt(V_{dd} - V_t - \Delta)^2}{(C_{row}(1-p\Delta) + nkt(V_{dd} - V_t - \Delta))}$$

The sense amplifier at this replica node senses a high when:

$$V_x \geq V_{dd}/2$$

If the capacitance of the rows is less (or time allowed to charge the replica node is high or the number of discharging cells is high), then, $$V_x \approx (V_{dd} - V_t - \Delta)$$

So, the node is sensed as high when:

$$V_{dd}/2 \geq (V_t + \Delta)$$

In a generic case, when the capacitance of the rows is high, then the node is sensed as high when:

$$\frac{nkt(V_{dd} - V_t - \Delta)^2}{(C_{row}(1-p\Delta) + nkt(V_{dd} - V_t - \Delta))} \geq V_{dd}/2$$

$$2nkt(V_{dd} - V_t - \Delta)^2 \geq CV_{dd} + nktV_{dd}^2 - nktV_{dd}V_t - nktV_{dd}\Delta$$

$$2nkt(V_{dd}^2 + V_t^2 + \Delta^2 - 2V_{dd}V_t - 2V_{dd}\Delta + 2V_t\Delta) \geq$$
$$CV_{dd} + nktV_{dd}^2 - nktV_{dd}V_t - nktV_{dd}\Delta$$

Considering boundary condition and equating, $$nktV_{dd}^2 - 3nktV_{dd}V_t - 3nktV_{dd}\Delta - CV_{dd} + 2nkt(V_t+\Delta)^2 = 0$$

Solving for $V_{dd}$ in this quadratic equation, $$V_{dd} \geq \frac{3}{2}(V_t + \Delta) + \frac{C}{2nkt} + \sqrt{\left(\frac{(V_t + \Delta)}{2} + \frac{C}{2nkt}\right)^2 + \frac{C(V_t + \Delta)}{nkt}}$$

$$V_{dd} \geq \frac{3}{2}(V_t + \Delta) + \frac{C_{row}(1-p\Delta)}{2nkt} +$$
$$\sqrt{\left(\frac{(V_t + \Delta)}{2} + \frac{C_{row}(1-p\Delta)}{2nkt}\right)^2 + \frac{C_{row}(1-p\Delta)(V_t + \Delta)}{nkt}}$$

The following can be deduced about the operation of the memory 20 from the above equation.

1. Slow lots (high $\Delta$) will result in a low output at a higher voltage than fast lots (low $\Delta$);
2. Large number of rows result in a low output at a higher voltage;
3. Low value of voltage results in a low output;
4. To increase lot sensitivity, the drain capacitance component of replica node is to be reduced; and
5. To increase voltage sensitivity, the number of discharging cells and the duration of discharge is to be kept low.

Based on these observations, the assist determination controller 70 may be used for various applications in static memory designs.

1. Sensing voltage lowering and activating write assist circuits (saving dynamic power and reliability concerns at high voltages);
2. Deciphering the duration for which the assist circuit should be applied (slow lots activate assist for a longer duration to improve write time);
3. Deciding the amount of assist to be applied (extra assist can be applied for large rows and slow lots); This saves dynamic power for fast lots and reduces reliability concerns when parasitic are less; and
4. Reducing the delay in the self-timing path during memory operation to save dynamic power in fast lots and at high voltages or increase delays in the self-timing path at low voltages.

In a still more generic case, a sense amplifier will sense a high at a voltage above $sV_{dd}$, then:

$$\frac{nkt(V_{dd} - V_t - \Delta)^2}{(C_{row}(1-p\Delta) + nkt(V_{dd} - V_t - \Delta))} \geq sV_{dd}$$

$$nkt(V_{dd} - V_t - \Delta)^2 \geq sCV_{dd} + snktV_{dd}^2 - snktV_{dd}V_t - snktV_{dd}\Delta$$

Considering boundary condition and equating, $$(1-s)nktV_{dd}^2 - (2-s)nktV_{dd}V_t - (2-s)nktV_{dd}\Delta - s CV_{dd} + nkt(V_t+\Delta)^2 = 0$$

Solving for $V_{dd}$ in this quadratic equation, $$V_{dd} \geq \frac{(2-s)nkt(V_t + \Delta) + sC + \sqrt{s^2(nkt(V_t+\Delta)-C)^2 + 4snktC(V_t+\Delta)}}{2(1-s)nkt}$$

$$V_{dd} \geq \frac{(2-s)}{2(1-s)}(V_t+\Delta) + \frac{s}{2(1-s)}\frac{C}{nkt} + \sqrt{\frac{s^2}{4(1-s)^2}\left((V_t+\Delta) - \frac{C}{nkt}\right)^2 + \frac{s}{(1-s)^2}\frac{C(V_t+\Delta)}{nkt}}$$

The following can be additionally deduced from the above equations:
1. By keeping the sensing voltage to a very low level (less than 6 kT/q), the above equations fail because the nMOS enters into a linear region;
2. If sensing voltage is very low (but more than 6 kT/q), then dependence on capacitance can be significantly reduced. This sensor can then be used to sense operation in sub-threshold region;
3. When sensing voltage is kept high (e.g., $0.9V_{dd}$), this sensor fails and senses a low (assuming overdrive of $<5V_t$); and
4. It is preferable to tune the sensing voltage around $V_{dd}/2$, depending on at what voltage the low voltage Without loss of generality, alternate configurations of this circuit can be used for tuning the size of diodes used to ensure sufficient retention voltages in SRAMs with embedded switches and/or related power saving features, and to apply read assist circuits at low voltages and fast (nMOS) lots to improve SNM. Those skilled in the art will appreciate that many more uses of the output of such an arrangement can be identified.

For the discharge memory device 42(1) as illustrated in FIG. 3, it is configured similar to an active memory cell. The discharge memory device 42(1) includes memory transistors configured as invertors 104, 106, and the discharge transistor 100 is configured as an access transistor coupled to the memory transistors. The sense line 120 corresponds to a bit line and the activation line 122 corresponds to a word line even though these lines are dedicated to the sense determination controller 70 and the sensing circuit 50.

For the load memory device 44(1) as illustrated in FIG. 4, only a single load transistor 102 is used. The load transistor 102 also corresponds to an access transistor even though the memory transistors are not used. Alternatively, the load memory device 44(1) may be configured similar to the discharge memory device 42(1). The load memory device 44(1) and the discharge memory device 42(1) are not limited to any particular configuration as long as they are programmable to a desired logic value, and are coupled to the sense line 120 and the activation line 122.

Figure 5:
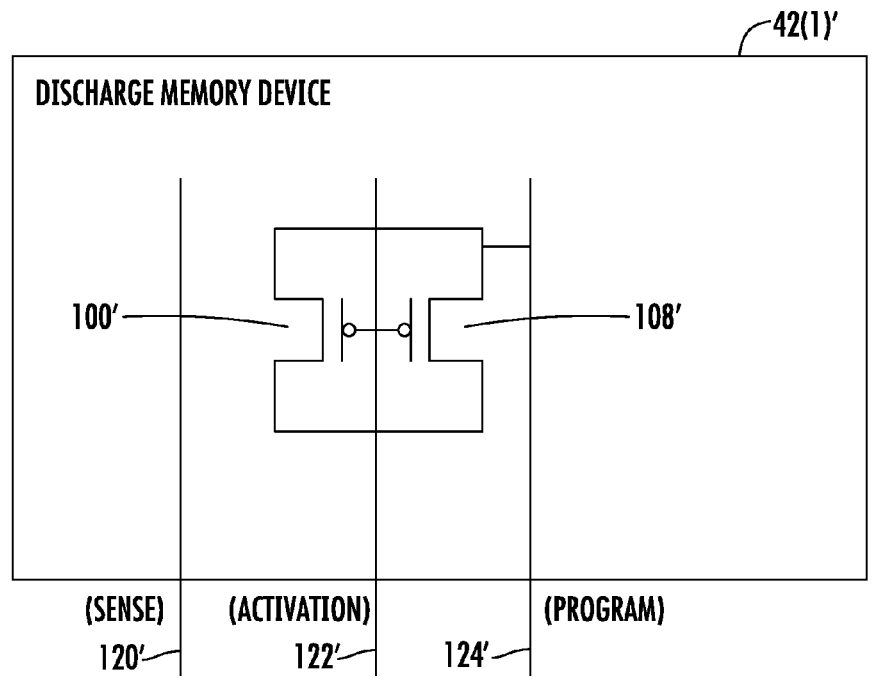
FIG. 5 is a more detailed block diagram of another embodiment of the discharge memory device illustrated in FIG. 2.

Other embodiments of the discharge memory device 42(1) will now be discussed in reference to FIGS. 5 and 6. These configurations are also applicable to the load memory device 44(1). The discharge memory device 42(1)' may include at least one additional transistor 108', and wherein the discharge transistor 100' is coupled to the additional transistor to define a pair of pull-up devices, as illustrated in FIG. 5. The pair of pull-up devices operate in response to a sense line 120', an activation line 122', and a program line 124'.

Figure 6:
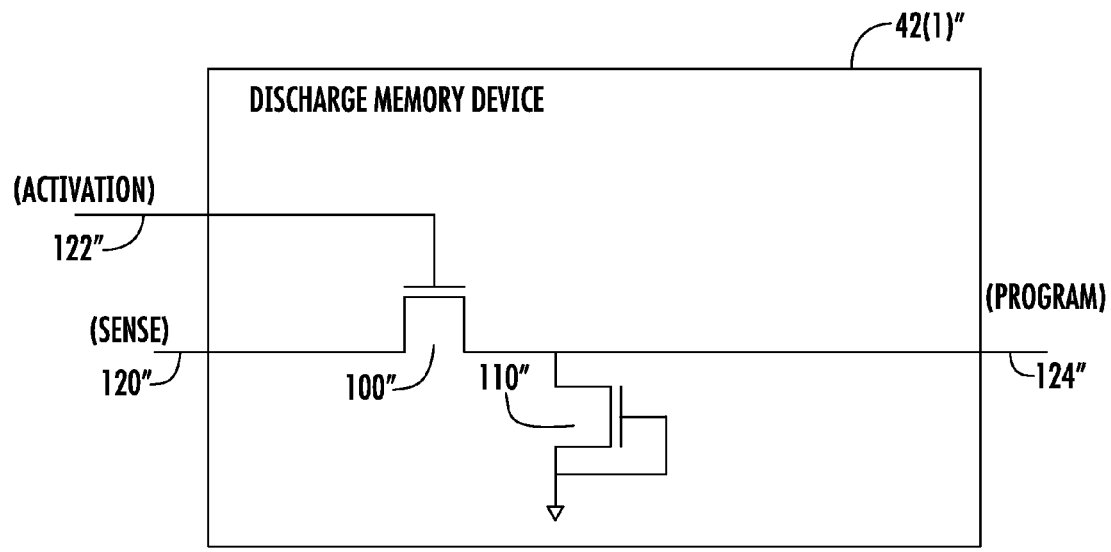
FIG. 6 is a more detailed block diagram of yet another embodiment of the discharge memory device illustrated in FIG. 2.

In FIG. 6, the discharge transistor 100" in the illustrated discharge memory device 42(1)' is configured as a pull-down device. The pull-down device is coupled to an inactive transistor 110". The pair of pull-down devices operate in response to a sense line 120", an activation line 122", and a program line 124".

The assist determination controller 70 is also configured to periodically determine the output assist value, and to periodically operate the assist circuit 60 based upon the determined output assist value. This may be performed before a write/read cycle, for example. In addition, the assist determination controller 70 may be configured to store the look-up table of output assist values further based on different operating voltages. This helps to tune or calibrate the sense and activation lines 120, 122 so as to provide more accurate sensing by the sensing circuit 50.

Figure 7:
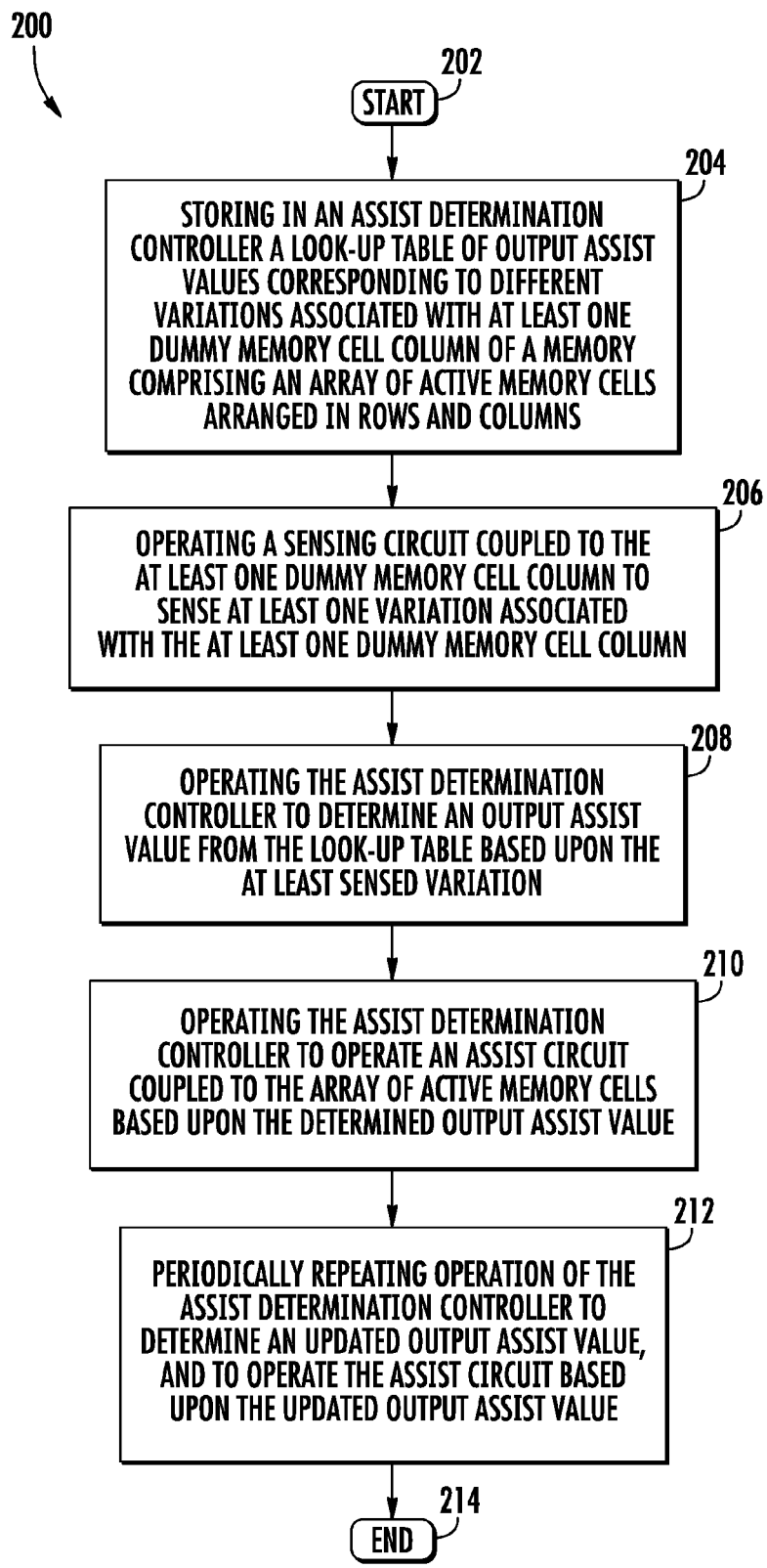
FIG. 7 is a flowchart illustrating a method for operating the memory with an assist determination controller illustrated in FIG. 1.

Referring now to the flowchart 200 in FIG. 7, another aspect is directed to a method for operating a memory 20 as described above. The method comprises, from the start (Block 202), storing a look-up table of output assist values 80 corresponding to different variations associated with the dummy memory cell columns 42(1)-42(n) at Block 204. The sensing circuit 50 is operated at Block 206 to sense at least one variation associated with the dummy memory cell columns 42(1)-42(n). The assist determination controller 70 is operated at Block 208 to determine an output assist value from the look-up table 80 based upon the at least sensed variation, and to operate the assist circuit 60 based upon the determined output assist value at Block 210. The method further comprises periodically operating the assist determination controller 70 at Block 212 to determine the output assist value, and to periodically operate the assist circuit 60 based upon the determined output assist value. The method ends at Block 214.

Many modifications and other embodiments will come to the mind of one skilled in the art having the benefit of the teachings presented in the foregoing descriptions and the associated drawings. Therefore, it is understood that the disclosure is not to be limited to the specific embodiments disclosed, and that modifications and embodiments are intended to be included within the scope of the appended claims.

That which is claimed is:
1. A memory comprising:
   an array of active memory cells arranged in rows and columns;
   at least one dummy memory cell column adjacent said array of active memory cells;
   a sensing circuit coupled to said at least one dummy memory cell column and configured to sense at least one variation associated with said at least one dummy memory cell column;
   an assist circuit coupled to said array of active memory cells; and
   an assist determination controller coupled to said sensing circuit and configured to
      store a look-up table of output assist values corresponding to different variations associated with said at least one dummy memory cell column,
      determine an output assist value from the look-up table based upon the at least sensed variation, and
      operate said assist circuit based upon the determined output assist value.
2. The memory according to claim 1 wherein said at least one dummy memory cell column comprises:
   a plurality of programmable discharge memory devices, with each programmable discharge memory device comprising at least one discharge transistor; and
   a plurality of programmable load memory devices, with each programmable load memory device comprising at least one load transistor.

3. The memory according to claim 2 wherein said at least one dummy memory cell column comprises:
- at least one sense line coupled to said plurality of programmable discharge memory devices and to said plurality of programmable load memory devices;
- at least one activation line coupled to said plurality of programmable discharge memory devices;
- at least one programmable discharge programming line coupled to said plurality of programmable discharge memory devices; and
- at least one programmable load programming line coupled to said plurality of programmable load memory devices.

4. The memory according to claim 3 wherein said at least one sense line is coupled to said plurality of programmable discharge memory devices via said respective discharge transistors, and to said plurality of programmable load memory devices via said respective load transistors.

5. The memory according to claim 3 wherein said assist determination controller is configured to:
- program said plurality of programmable discharge memory devices via said at least one programmable discharge programming line; and
- program said plurality of programmable load memory devices via said at least one programmable load programming line.

6. The memory according to claim 3 wherein said assist determination controller is configured to:
- activate said plurality of programmable discharge memory devices; and
- activate said sensing circuit at a set time after activation of said plurality programmable discharge memory devices to sense the at least one variation associated with said at least one dummy memory cell column.

7. The memory according to claim 2 wherein each programmable discharge memory device comprises at least one memory transistor; and wherein said at least one discharge transistor is configured as an access transistor coupled to said at least one memory transistor.

8. The memory according to claim 2 wherein each programmable discharge memory device comprises at least one additional transistor; and wherein said at least one discharge transistor is coupled to said at least one additional transistor to define a pair of pull-up devices.

9. The memory according to claim 2 wherein said at least one discharge transistor is configured as a pull-down device.

10. The memory according to claim 1 wherein the at least one variation comprises at least one of a process variation, a voltage variation, a temperature variation, and a leakage current variation.

11. The memory according to claim 1 wherein said assist determination controller is configured to periodically determine the output assist value, and to periodically operate said assist circuit based upon the determined output assist value.

12. The memory according to claim 1 wherein said assist determination controller is configured to store the look-up table of output assist values further based on different operating voltages.

13. The memory according to claim 1 wherein said array of active memory cells is configured so that the memory is a static memory.

14. A static memory comprising:
- an array of active memory cells arranged in rows and columns;
- at least one dummy memory cell column adjacent said array of active memory cells and comprising
  - a plurality of programmable discharge memory devices, with each programmable discharge memory device comprising at least one discharge transistor, and
  - a plurality of programmable load memory devices, with each load memory device comprising at least one load transistor;
- a sensing circuit coupled to said at least one dummy memory cell column and configured to sense at least one variation associated with said at least one dummy memory cell column;
- an assist circuit coupled to said array of active memory cells; and
- an assist determination controller coupled to said sensing circuit and configured to
  - store a look-up table of output assist values corresponding to different variations associated with said at least one dummy memory cell column,
  - determine an output assist value from the look-up table based upon the at least sensed variation, and
  - operate said assist circuit based upon the determined output assist value.

15. The static memory according to claim 14 wherein said at least one dummy memory cell column comprises:
- at least one sense line coupled to said plurality of programmable discharge memory devices and to said plurality of programmable load memory devices;
- at least one activation line coupled to said plurality of programmable discharge memory devices;
- at least one programmable discharge programming line coupled to said plurality of programmable discharge memory devices; and
- at least one programmable load programming line coupled to said plurality of programmable load memory devices.

16. The static memory according to claim 15 wherein said at least one sense line is coupled to said plurality of programmable discharge memory devices via said respective discharge transistors, and to said plurality of programmable load memory devices via said respective load transistors.

17. The static memory according to claim 15 wherein said assist determination controller is configured to:
- activate said plurality of programmable discharge memory devices; and
- activate said sensing circuit at a set time after activation of said plurality programmable discharge memory devices to sense the at least one variation associated with said at least one dummy memory cell column.

18. The static memory according to claim 14 wherein the at least one variation comprises at least one of a process variation, a voltage variation, a temperature variation, and a leakage current variation.

19. A method for operating a memory comprising an array of active memory cells arranged in rows and columns; at least one dummy memory cell column adjacent the array of active memory cells; a sensing circuit coupled to the at least one dummy memory cell column; an assist circuit coupled to the array of active memory cells; and an assist determination controller coupled to the sensing circuit and configured to store a look-up table of output assist values corresponding to different variations associated with the at least one dummy memory cell column, the method comprising:
- operating the sensing circuit to sense at least one variation associated with the at least one dummy memory cell column; and
- operating the assist determination controller to
  - determine an output assist value from the look-up table based upon the at least sensed variation, and operate the assist circuit based upon the determined output assist value.

20. The method according to claim 19 wherein the at least one dummy memory cell column comprises a plurality of programmable discharge memory devices, with each programmable discharge memory device comprising at least one discharge transistor; and a plurality of programmable load memory devices, with each programmable load memory device comprising at least one load transistor.

21. The method according to claim 20 wherein the at least one dummy memory cell column comprises:
  at least one sense line coupled to the plurality of programmable discharge memory devices and to the plurality of programmable load memory devices;
  at least one activation line coupled to the plurality of programmable discharge memory devices;
  at least one programmable discharge programming line coupled to the plurality of programmable discharge memory devices; and
  at least one programmable load programming line coupled to the plurality of programmable load memory devices.

22. The method according to claim 21 wherein the at least one sense line is coupled to the plurality of programmable discharge memory devices via the respective discharge transistors, and to the plurality of programmable load memory devices via the respective load transistors.

23. The method according to claim 21 wherein operating the assist determination controller further comprises:
  programming the plurality of programmable discharge memory devices via the at least one programmable discharge programming line; and
  programming the plurality of programmable load memory devices via the at least one programmable load programming line.

24. The method according to claim 21 wherein operating the assist determination controller further comprises:
  activating the plurality of programmable discharge memory devices; and
  activating the sensing circuit at a set time after activation of the plurality programmable discharge memory devices to sense the at least one variation associated with the at least one dummy memory cell column.

25. The method according to claim 19 wherein the at least one variation comprises at least one of a process variation, a voltage variation, a temperature variation, and a leakage current variation.

26. The method according to claim 19 wherein the assist determination controller is operated to periodically determine the output assist value, and to periodically operate the assist circuit based upon the determined output assist value.

* * * * *

UNITED STATES PATENT AND TRADEMARK OFFICE
CERTIFICATE OF CORRECTION

PATENT NO. : 8,982,651 B2  
APPLICATION NO. : 13/852222  
DATED : March 17, 2015  
INVENTOR(S) : Grover et al.

It is certified that error appears in the above-identified patent and that said Letters Patent is hereby corrected as shown below:

In the Claims

Column 11, Line 33, Claim 6,    Delete: "plurality programmable"  
                                Insert: --plurality of programmable--

Column 12, Line 45, Claim 17,   Delete: "plurality programmable"  
                                Insert: --plurality of programmable--

Column 14, Line 15, Claim 24,   Delete: "plurality programmable"  
                                Insert: --plurality of programmable--

Signed and Sealed this  
Eighteenth Day of August, 2015

Michelle K. Lee  
*Director of the United States Patent and Trademark Office*